US006839547B2

United States Patent
Nir et al.

(10) Patent No.: US 6,839,547 B2
(45) Date of Patent: Jan. 4, 2005

(54) ENHANCED GPS RECEIVER UTILIZING WIRELESS INFRASTRUCTURE

(75) Inventors: Joseph Nir, Rehovot (IL); Baruch Shayevits, Rishon Lezion (IL); Hanoch Cohen, Rishon Lezion (IL)

(73) Assignee: CellGuide Ltd., Rehovot (IL)

( * ) Notice: Subject to any disclaimer, the term of this patent is extended or adjusted under 35 U.S.C. 154(b) by 584 days.

(21) Appl. No.: 09/727,752

(22) Filed: Dec. 4, 2000

(65) Prior Publication Data

US 2001/0034210 A1 Oct. 25, 2001

Related U.S. Application Data

(60) Provisional application No. 60/193,236, filed on Mar. 30, 2000.

(51) Int. Cl.[7] .............................. H04B 1/00; H04B 7/00
(52) U.S. Cl. ..................... 455/71; 455/12.1; 455/13.2; 455/427; 455/67.16; 455/456.1; 455/255; 342/357.06; 342/352; 342/357.12; 342/357.05
(58) Field of Search ...................... 455/71, 12.1, 13.1, 455/13.2, 427, 456.1, 456.6, 502, 255, 257, 265, 67.16; 342/357.01, 357.02, 357.05, 357.06, 356, 357.12, 357.15

(56) References Cited

U.S. PATENT DOCUMENTS

| | | | | |
|---|---|---|---|---|
| 4,959,656 A | * | 9/1990 | Kumar | 342/418 |
| 5,043,736 A | * | 8/1991 | Darnell et al. | 342/357.1 |
| 5,448,773 A | * | 9/1995 | McBurney et al. | 455/343.6 |
| 5,629,708 A | * | 5/1997 | Rodal et al. | 342/357.15 |
| 5,663,734 A | | 9/1997 | Krasner | |
| 5,663,735 A | | 9/1997 | Eshenbach | |
| 5,841,396 A | | 11/1998 | Krasner | |
| 5,874,914 A | * | 2/1999 | Krasner | 342/357.12 |
| 5,999,124 A | * | 12/1999 | Sheynblat | 342/357.09 |
| 6,064,336 A | * | 5/2000 | Krasner | 342/357.05 |
| 6,208,290 B1 | * | 3/2001 | Krasner | 342/357.05 |
| 6,240,276 B1 | * | 5/2001 | Camp, Jr. | 455/71 |
| 6,259,404 B1 | * | 7/2001 | Parl et al. | 342/457 |
| 6,285,316 B1 | * | 9/2001 | Nir et al. | 342/357.09 |
| 6,400,314 B1 | * | 6/2002 | Krasner | 342/357.09 |
| 6,408,178 B1 | * | 6/2002 | Wickstrom et al. | 455/427 |

* cited by examiner

*Primary Examiner*—Marceau Milord
(74) *Attorney, Agent, or Firm*—Mark M. Friedman

(57) ABSTRACT

A locator using Navstar constellation signals for determining geographical location of a mobile receiver. The locator is integrated with a mobile unit of a cellular network, which derives its reference frequency from a local oscillator (26). A frequency measuring module (28) counts the number of digital numbers derived from the local oscillator passing between two consecutive time-tagged indicators of the cellular network. The estimated frequency is calculated by dividing the number of digital numbers by the nominal time interval ($T_0$) between the indicators.

3 Claims, 3 Drawing Sheets

ENHANCED GPS RECEIVER UTILIZING WIRELESS INFRASTRUCTURE

This application claims the benefit of Provisional application No. 60/193,236, filed Mar. 30, 2000.

FIELD OF THE INVENTION

The present invention relates to GPS receivers and more particularly to GPS devices incorporating links to a cellular communication network.

BACKGROUND OF THE INVENTION

A standard GPS receiver determines its position relative to the satellite constellation by measuring propagation time of signals transmitted simultaneously from Navstar satellites. This constellation consists of 24 satellites each orbiting the earth in 12 hours time, such that any user has always a line of sight to 5–10 satellites. Each satellite transmits a continuous pseudorandom (PRN) noise sequence with a chip rate of 1023 KHz, and a repetition period of 1023 chips. Each satellite has its own particular PRN sequence, which has good correlation properties and is orthogonal to the PN sequences of the other satellites.

Superimposed on the PRN sequence is a satellite data message. The data message includes positioning data (Almanac and Ephemeris), clock timing data and time of week (TOW) data. The GPS processor locks on a specific visible satellite signal using correlation techniques often performed by a correlator, to correlate between the received signals and a known replica of the transmitted signal from the satellite. In urban environment and under dense canopy of trees, the satellite signals are likely to become weak, consequently decreasing the feasibility of achieving good correlation between stored replicas and a detected signal. The probability of achieving correlation and subsequent lock with such weak satellite signals increases as the accuracy of the local timing reference gets better.

After lock has been achieved, positioning and time data (ephemeris and TOW) are demodulated from the carrier signal. The correlation and data extraction sequence described above is repeated for at least three more satellite codes in order to obtain earth position of receiver in 3 dimensions. The frequency of the received GPS signal is generally shifted with respect to the satellite-outgoing signal, such that unless corrected for, a correlation with the satellite PRN sequence may not occur. The instantaneous frequency shift of the received GPS signal is composed of three instantaneous components, as described in equation 1:

$$\omega = \omega_s + \omega_m + \omega_{clock}$$

Where $\omega$=frequency shift, $\omega_s$=Satellite Doppler frequency shift, $\omega_m$=Mobile unit Doppler frequency shift, ~zero for a pedestrian or a known value for a known vehicle velocity, $\omega_{clock}$=Mobile Unit clock shift.

The local clock shift is the major contributing factor to the received GPS signal frequency shift, with an error reaching as high as a few ppms of the satellite signal, which in terms of frequency deviation is in the range of a few KHz of satellite signal. It is therefore of highest priority to correct its deviation. The other two contributions to frequency shift may be estimated based on a prior knowledge of the velocity parameters of the MU and of the GPS satellites. Most GPS receivers tune their local reference using a frequency search. In such a standard processing technique, the frequency shift can be estimated and a separate correlation for each estimate is performed. However, by performing the correlation for every estimate, the processing time is lengthened, resulting in excessively long time spent on obtaining a reliable correlation. In light of the above, the need for calibrating local clocks or oscillators is therefore evident. One such method is disclosed in U.S. Pat. No. 5,841,396 a method for calibrating the frequency of the local clock of a local GPS receiver by locking on to a wireless precision carrier. This carrier has a known frequency, which is used to correct the frequency of the local clock.

SUMMARY OF THE INVENTION

An object of the present invention is to provide a method and an apparatus for calibrating a local oscillator of a mobile cellular unit in order to enhance the accuracy of pseudorange calculation to the GPS satellites.

Another aspect of the present invention is to provide a method for correcting the frequency shift of received GPS signal, by utilizing wireless communication synchronization signals.

A further object of the present invention is to provide a method of decreasing the time required for increased sensitivity in correlating weak GPS signal as performed in a mobile cellular unit.

There is thus provided, in accordance with a preferred embodiment of the present invention, a locating unit integrated with a MU (mobile unit) of a cellular network system.

DETAILED DESCRIPTION OF THE PRESENT INVENTION

Figure 1:
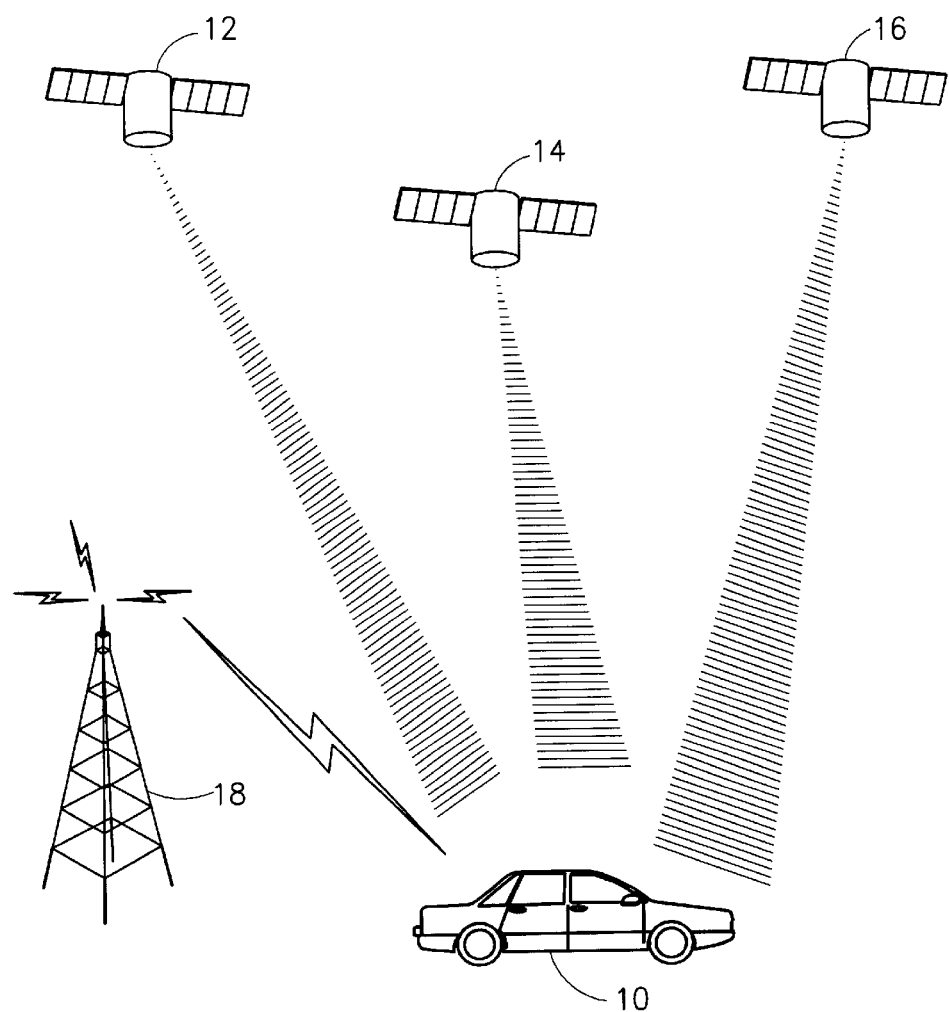
FIG. 1 is a schematic layout of the signal sources that a mobile unit of the present invention utilize for determining pseudoranges to GPS satellites.

In order to perform location measurements, a standard commercial GPS receiver utilizes data of several satellites of the Navstar constellation concomitantly. According to the present invention, a typical data-source layout of a MU (mobile receiver unit) includes at least two types of data sources. FIG. 1 to which reference is now made, describes a MU receiving data from satellite sources 12, 14, and 16. According to the present invention, the locator integrated with a MU receives signals from a cellular network source 18 out of which synchronization data is extracted.

Correcting for Local Clock Frequency Shift

The local oscillator of the MU provides reference frequency for the time dependent processes associated with the location measurements. The local oscillator however exhibits drift characteristics which potentially impair the accuracy of the measurements.

Figure 2:
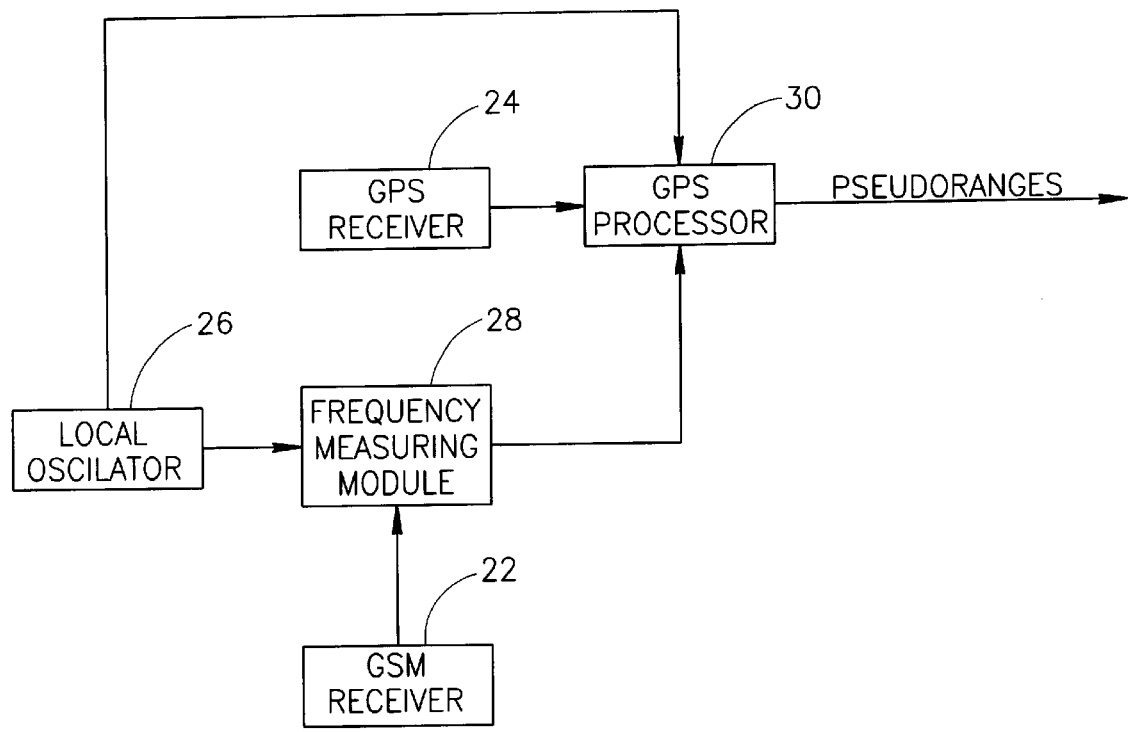
FIG. 2 is a block diagram representation of a general configuration of a system involving communication time calibration according to the present invention.

According to the present invention, the local clock frequency shift is corrected for by referencing the MU's local oscillator to the synchronization frames of the cellular communication signal with which it is associated. FIG. 2, to which reference is now made, illustrates schematically the configuration of the system of a preferred embodiment of the present invention, which acquires and uses a digital cellular communication signal for frequency shift correction of the locator integrated with the MU. Thus, according to the instant invention, signals of a cellular network, such as GSM, are intercepted by a receiver 22, while the GPS receiver 24 intercepts the navigation satellites' signals. A local oscillator 26 of the MU has a nominal output frequency $F_n$, which is measured by the FMM (frequency measurement module) 28. The FMM determines the instantaneous frequency of the local oscillator based on the synchronization signals obtained from the GSM receiver 22, as will be elaborated later on. A GPS processor 30 extracts data from the GPS signal out of which pseudoranges to the various satellites are calculated. The FMM 28 sends to the GPS processor 30 the corrected frequency, obtained in a way as will be explained later on.

It will be appreciated that in the practice, there may be several sources of network signals utilizable for synchronization of receiver oscillator besides the synchronization frames. In fact any sequence of time-tagged indications transmitted by the network signal, may be utilized for the purpose of calibrating the local oscillator's instantaneous shift, as long as their accuracy is better than that of the local oscillator. In any case, the form of the synchronization signal must be known in order to relate each time reading to a specific phase on the synchronization signal.

Figure 3A:
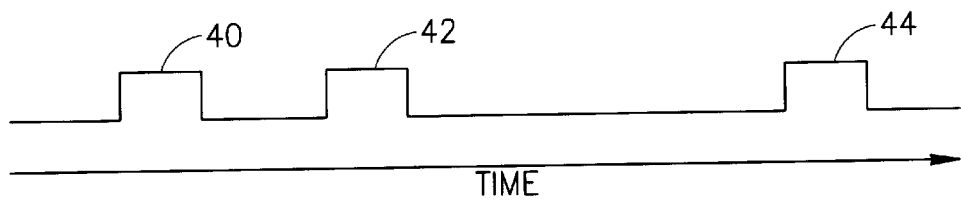
FIG. 3A is a graph showing synchronization frames transmitted by a base station of a cellular network.
Figure 3B:
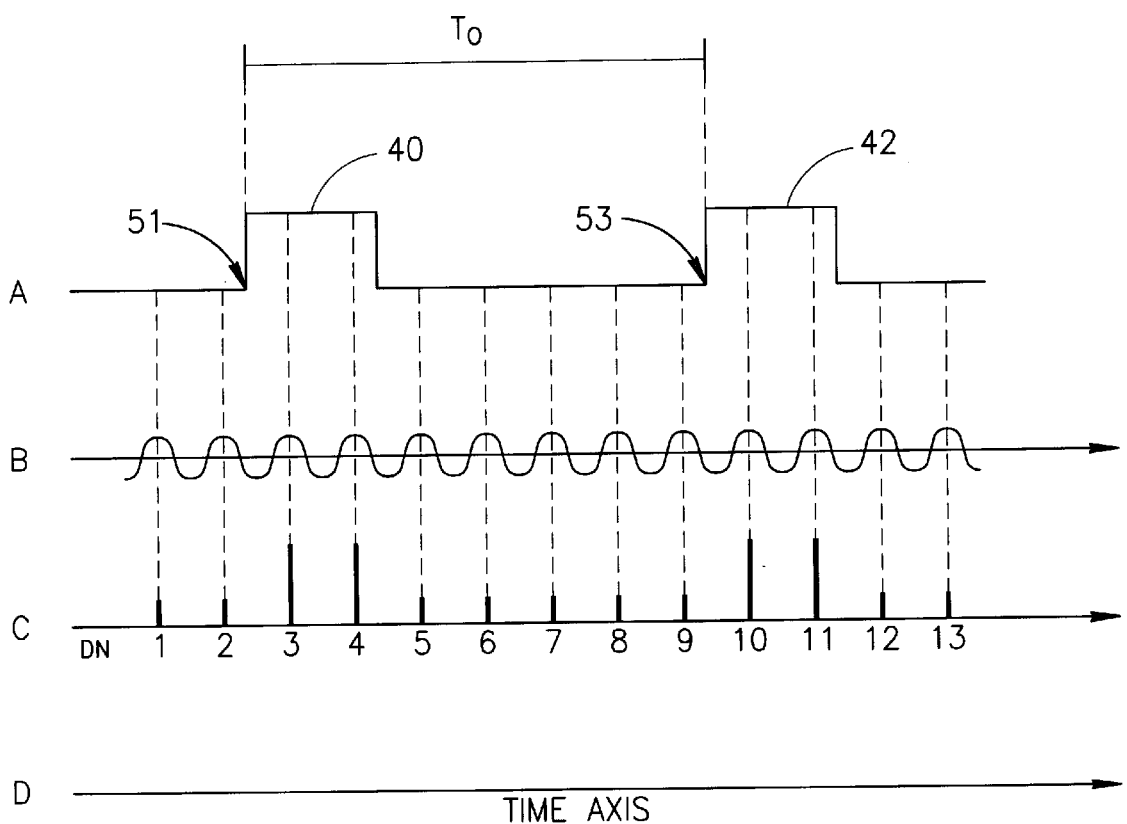
FIG. 3B is a graph illustrating the projection of local oscillator cycles on the transmitted synchronization frames of the cellular network, and the subsequent derivation of digital numbers from the relative location of the frames on the time axis.

Measuring the instantaneous shift in frequency of the local oscillator from the nominal frequency Fn, starts by receiver 22 locking onto a reference cellular network signal and performing several processing steps as is explained in FIGS. 3A and 3B. The cellular network transmits an RF signal, carrying synchronization frames in predefined time intervals as is shown in FIG. 3A to which reference is now made. Thus, the time interval between frames 40 and 42 is known because it is characterized in the specifications of the network, and the time interval between frames 42 and 44, which may be different from the former interval, is also defined. Moreover, the time interval between each two such frames is precise to the extent that, for example, in GSM less than 0.2 ppm error frequency can be expected.

The synchronization frames are extracted from the digitized baseband of the downconverted RF signal. In order to make accurate measurements of time intervals between two such synchronization frames in accordance with the present invention, the synchronization frames are referenced respective of a specific phase in such a frame. A convenient reference point is the frame's leading edge start. In FIG. 3B to which reference is now made, two consecutive reference frames on line A, namely 40 and 42 both have a leading edge, at a flank directed towards time origin. The arrows 51 and 53 respectively denote the start of the leading edge of frames 40 and 42. In order to locate the projection of arrowheads 51 and 53 on the time axis of the MU, the signal is processed and frames thereof identified. In the example of FIG. 3B, the local oscillator cycles, represented by line B, are used for digitization of the cellular signal, as illustrated in the FIG. 3B. The cycles are projected on the synchronization signal and samples from the synchronization signal are taken for each local oscillator cycle, as denoted by the projected dotted lines. In the resulting digitized cellular signal, as denoted by line C, timing frames are identified by a larger digital number as compared to the digital number (DNs) sampled from the baseline between such frames. The exact insertion of arrows 51 or 53 in the line A takes place somewhere between two digital numbers: arrow 51 between digital number 2 and 3 and arrow 53 between digital numbers 9 and 10 respectively. Therefore a fractional number of digital numbers can be allocated for a time interval $T_O$.

Frame numbers are then demodulated and the nominal time interval thus becomes known. Then, the estimated frequency ($F_m$) of the local oscillator is calculated accordingly, as shown in equation 2:

$$F_m = N/T_O$$

Where $F_m$=Estimated local oscillator frequency,

N=Fractional number of digital numbers between arrows 51 and 53

$T_O$=Nominal time interval between arrows 51 and 53.

The accuracy of the estimation measurement can be increased by calculating the mean of several different estimates as obtained above in equation 2, as follows:

equation 3:

$$\overline{F}_m = \frac{\sum F_m(j)}{\sum j}$$

Where $F_m$=Estimated local oscillator frequency, j=Signal sample $F_m$ is then used by the GPS processor for the various calculations requiring a clock.

Re-Use of Estimated Local Oscillator Frequency $F_m$

Local oscillator exhibits performance parameters which not only shift in time, but also change their shift characteristics, i.e. a drift in oscillation frequency is expected. Obviously, shortly after determination of instantaneous time shift, parameters can be considered as unchanged for a while. Practically therefore, when a large time lapse has occured between a location-processing event and the last calibration event, new calibration is preferably performed. The estimated frequency value is therefore stored in the MU for subsequent use.

Correcting for Frequency Shifts Caused by Doppler Effect

Such calibration is of secondary importance as compared to local oscillator shift correction but nonetheless bears its own significant impact. Prior art methods for obtaining Doppler calibration data are employed in the present invention.

What is claimed is:

1. A locator integrated with a mobile receiver unit of a cellular network for determining pseudoranges to Navstar satellites, wherein a local oscillator of said locator receives synchronization data from said cellular network for correcting a frequency shift of said local oscillator relative to time-tagged indications of said cellular network, comprising:

a frequency measuring module for determining a number of digital numbers produced by said local oscillator per nominal interval between time-tagged indications transmitted by said cellular network, and a GPS processor for Navstar signals and for receiving said local oscillator frequency, and for receiving an output of said frequency measuring module.

2. A method for correcting oscillator frequency of a locator integrated with a mobile unit, wherein said locator calculates pseudoranges to Navstar satellites based on timing of said satellite code arrivals, and wherein cellular network data is used for calibrating said oscillator of said locator, said method comprising:

receiving time-tagged indications transmitted by said cellular network, digitizing said time-tagged indications with reference to said oscillator of said locator, determining a fractional number of digital numbers of said oscillator in a time interval between two time-tagged indications transmitted by said wireless network, estimating a frequency for said oscillator by dividing said number of digital numbers by said time interval, and sending said estimated frequency for use by a GPS processor.

3. A method for correcting a local oscillator frequency of a locator integrated with a mobile unit as in claim 2, and wherein said time-tagged signals are synchronization frames of said cellular network.

* * * * *